United States Patent [19]

Kato

[11] Patent Number: 4,679,089

[45] Date of Patent: Jul. 7, 1987

[54] SOLID STATE IMAGE SENSOR HAVING AN ANTI-BLOOMING ISOLATION ELECTRODE

[75] Inventor: Toshiaki Kato, Miura, Japan

[73] Assignee: Fuji Electric Co., Ltd., Kawasaki, Japan

[21] Appl. No.: 828,288

[22] Filed: Feb. 11, 1986

[30] Foreign Application Priority Data

Feb. 15, 1985 [JP] Japan .................................. 60-27771

[51] Int. Cl.$^4$ ............................................. H04N 3/14
[52] U.S. Cl. .................. 358/213.19; 357/30; 358/213.11
[58] Field of Search ............................ 357/24 LR, 30; 358/212–213, 294

[56] References Cited

U.S. PATENT DOCUMENTS 4,236,168 11/1980 Herbst ............................ 357/24 LR
4,242,700 12/1980 Weimer .............................. 358/213
4,477,835 10/1984 Berger et al. ....................... 358/213
4,570,076 2/1986 Hamano et al. ..................... 358/212

*Primary Examiner*—Gene Z. Rubinson
*Assistant Examiner*—Stephen Brinich
*Attorney, Agent, or Firm*—Brumbaugh, Graves, Donohue & Raymond

[57] ABSTRACT

An image sensor includes a layer of photosensitive amorphous silicon on one surface of which is a large area common electrode and on the opposite surface of which are an array of spaced discrete electrodes and an isolation electrode which intends in the spaces between the discrete electrodes but is spaced therefrom. In operation, the common electrode is maintained at a first d-c potential, the isolation electrode is maintained at a different second d-c potential and the discrete electrodes are switched in turn to the second potential and the current flowing therethrough is used.

3 Claims, 3 Drawing Figures

SOLID STATE IMAGE SENSOR HAVING AN ANTI-BLOOMING ISOLATION ELECTRODE

FIELD OF THE INVENTION

This invention relates to a solid state image sensor, and more particularly to one which employs a relatively large area. Such a sensor is particularly useful for processing graphic data in equipment used for facsimile transmission and/or character reading without elaborate optical systems for scaling down the image to be transmitted or read to fit the active region of the sensor.

BACKGROUND OF THE INVENTION

Various kinds of solid state image sensors are known. Many, for example, like those of the charge-coupled device type or the bucket-brigade type, require for the active photosensitive layer a high quality monocrystalline semiconductor layer, such as monocrystalline silicon. Because of the difficulty in making large area layers of this kind, such devices typically use active regions of limited area and need optical systems to scale down the image size to match such limited area. Sensors of this kind tend to be expensive, although they are the most sensitive.

There are forms known which do not require monocrystalline semi-conductive layers and so readily can have an active region of relatively large area. Typically, these use as the photosensitive material, either compound semiconductors, such as CdS and As-Se-Te, or elemental semiconductors such as amorphous silicon. Of these, there are two basic forms. The planar form uses spaced electrodes on the same surface of the active photosensitive layer, the sandwich form uses the photosensitive layer sandwiched between a large area common electrode and an array of spaced discrete electrodes.

The present invention is of the sandwich type. Typically in the past, such a sensor has comprised a large area electrode on one surface of a layer of amorphous silicon and an array of spaced discrete electrodes on the opposite surface of the layer. Each of the discrete electrodes corresponds to a picture element, or pixel, of the picture scene. One problem of an image sensor of this kind has been that it is not well adapted to provide sharp images. In particular, there is a tendency for charge carriers photogenerated in a region or picture element of high light intensity to diffuse laterally in the layer and be captured by an electrode associated with a picture element of low light intensity, which results in smearing of sharp transitions in the picture scene.

SUMMARY OF THE INVENTION

In an image sensor in accordance with the invention, an amorphous or polycrystalline photosensitive layer is sandwiched between a large area common electrode and an array of discrete electrodes, as in known forms of image sensors. However additionally, the discrete electrodes are separated from one another by portions of an isolation electrode which is also deposited on the same side of the photosensitive layer as are the discrete electrodes. In the preferred embodiment, the photosensitive layer is of amorphous silicon, and the isolation electrode is maintained at the d-c potential applied to the discrete electrodes for detecting the photogenerated current at such electrodes.

BRIEF DESCRIPTION OF THE DRAWINGS

With reference now to the drawing, FIG. 1 shows the prior art form of image sensor which employs an amorphous photosensitive layer as the active region and so is largely immune from the size limitations that affect image sensors of the kind that employ monocrystalline material for the active layer. The sensor 10 includes a dielectric substrate or base 11, for example of glass on which is deposited an array of discrete electrodes 12, over which in turn is deposited a layer 13 of the photosensitive material, such as amorphous silicon, and over which in turn is deposited the common electrode 14. If the image light to be converted enters the sensor by way of the substrate 11, the substrate 11 and the discrete electrodes 12 are designed to transmit incident light so that it can reach the photosensitive layer. Alternatively, the image light can be made to enter through the common electrode 14, in which case this electrode is made light transmissive. Indium-doped tin oxide is well known for use as a transparent electrode. Alternatively, it is also feasible first to deposit the common electrode on the substrate and then to deposit the discrete electrodes over the photosensitive layer. Reading of a sensor in either form typically is done by applying reading pulses sequentially to each of the discrete electrodes while maintaining the common electrode at a fixed voltage and passing the photo current derived at each electrode through a suitable load.

A disadvantage of a sensor of this kind is the smearing effect that is caused by diffusion of carriers photogenerated in a particularly bright picture element under one electrode to an adjacent electrode which overlies a dark picture element, where few if any carriers are being photogenerated. This gives a false reading when the current in the adjacent electrode is detected. One technique which might be used to overcome this problem would be to break up the continuous photosensitive layer into discrete portions to match the discrete electrodes. This would considerably increase the production cost of such devices since manufacturing yields would be decreased and so is unattractive.

Figure 1:
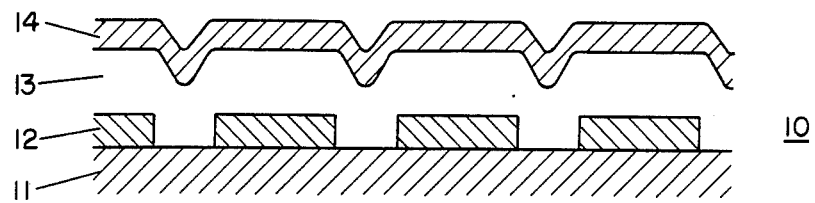
FIG. 1 shows in cross-section the basic elements of an image sensor of the prior art.
Figure 2A:
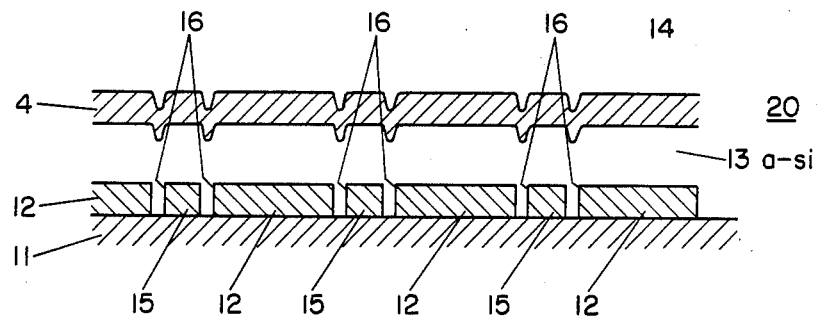
FIGS. 2A and 2B show a plan view and a section taken along the line A—A, respectively, of an image sensor in accordance with the invention.
Figure 2B:
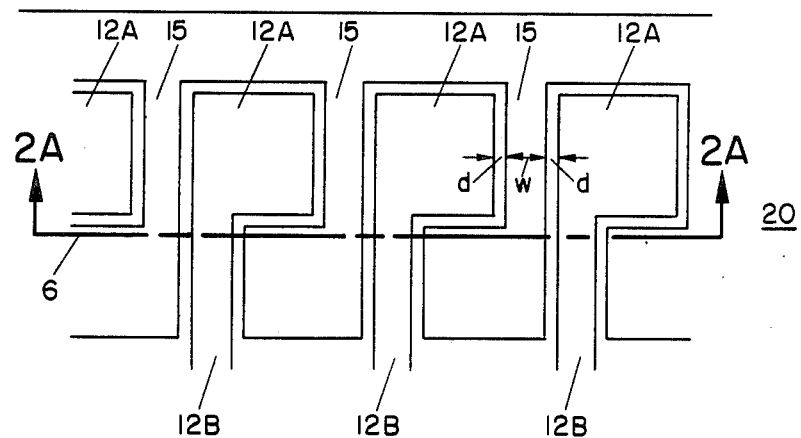

FIGS. 2A and 2B show an image sensor 20 embodying the principles of the invention. In these figures, the elements common to this sensor and sensor 10 shown in FIG. 1 have been given the same reference numerals. Sensor 20 is an embodiment intended primarily for use as a line scanner, for example in facsimile equipment where the document being read is rotated past it to be addressed one line at a time. To this end, it uses only a single line of discrete electrodes.

In sensor 20, the dielectric substrate 11 supports the discrete electrodes 12 and additionally the isolation electrode 15. As best seen in FIG. 2B, each of the discrete electrodes 12 comprises a substantially square portion 12A which serves as the primary active portion and to which is attached a thinner terminal portion 12B. These are largely enclosed within the common isolation or boundary electrode 15 which closely surrounds the square portions 12A, spaced therefrom only by the narrow border regions 16, best seen in FIG. 2A. Each of the terminal portions 12B is supplied to a separate lead (not shown) by means of which the current developed in the separate electrodes 12 is collected for flow through the load. Typically a reading pulse would be applied in turn to each of the discrete electrodes while a steady potential would be maintained on the large area base electrode 14, which overlies the photosensitive layer 13 which overlies electrodes 12 and 15.

Typically such a device could be formed as follows. A glass slide which is to serve as the support is coated with a thin layer of metal, such as chromium. This layer is then patterned in the usual fashion to define the various electrodes 12 and 15. Typically this involves photolithographic techniques. By way of example, the regions 12A might be 100 microns square and the border regions 16 5 microns wide and the width of the isolation or boundary electrode 15 in the corridors between the square regions 12A about 15 microns. The assembly is then coated with a layer about 1 micron thick of amorphous silicon, advantageously deposited by means of a high-frequency glow discharge of silcane gas diluted with hydrogen, a known method of depositing photosensitive amorphous silicon.

Deposition of the silicon layer is largely confined to the square regions 12A and the corridors therebetween, leaving the terminal regions 12B uncovered for ready access by the leads thereto. The silicon layer is then covered with a transparent conductor, which advantageously may be a layer about 700 Angstroms thick of transparent indium-doped tin oxide (ITO), to serve as the common or base electrode. This electrode should not be shorted to either electrodes 12 or 15.

In the device depicted, in normal operation the common or base electrode would be maintained at a steady d-c potential and the isolation or boundary electrode would be maintained at a steady potential different from that of the base electrode. The various discrete electrodes would be switched in turn advantageously to the potential of the isolation electrode, thereby to minimize planar effects which might arise if there was a potential difference between them. The signal currents derived at the discrete electrodes would be collected as a series of pulses corresponding to the switching rate in a common load for utilization. The various potentials are chosen to provide the desired level of signal currents. The signal currents derived would be used in the usual fashion dependent on the equipment involved.

Image sensors of this kind are designed to utilize primarily the photoconductive properties of the photosensitive semi-conductive layer. Alternatively, such an image sensor could be primarily modified in the usual fashion to utilize primarily the photovoltaic properties of the photosensitive semi-conductive layer.

Tests were performed in which a sensor of the kind described was used to sense dark lines in an image scene. The sensor was operated both with the isolation electrode floating, so as to be inactive, and with the isolation electrode biased at the same d-c voltage, established sequentially on the individual discrete electrodes for reading. In each case, there were measured the signal currents flowing between the individual discrete electrodes and the common electrode. The tests demonstrated that the biasing of the isolation electrode resulted in considerably sharper transitions in the signal currents corresponding to the dark lines.

The invention has been described with reference to a line scanner embodiment in which only a linear array of discrete electrodes is used. Alternatively, a two dimensional array of discrete electrodes may be used. This of course necessitates a more complex arrangement for accessing the discrete electrodes individually which could readily be devised by a worker in the art. For example, there may be utilized a two level metallization system of the kind known in the integrated circuit art for contacting the individual discrete electrodes.

Moreover, while the embodiment described involved the formation of the discrete electrodes and the isolation electrode on the surface of the support, alternatively, the common or base electrode might first have been deposited on the support, and the discrete electrodes and the isolation electrode later deposited over the photosensitive layer.

Moreover while amorphous silicon has been suggested for use in the preferred embodiment, other kinds of photosensitive semi-conductive materials can be substituted, for example, As-Se-Te, or other compound semiconductors.

What is claimed:

1. An image sensor comprising a large area electrode, a layer of a photosensitive material, overlying the large area electrode and an array of spaced discrete electrodes overlying the layer of photosensitive material, characterized in that an isolation electrode also overlies the layer of photosensitive material including portions in the spaces between the discrete electrodes but separated from the discrete electrodes.

2. An image sensor as in claim 1 further characterized in that the layer of photosensitive material is a layer of amorphous silicon.

3. An image sensor in accordance with claim 1 in which the large area electrode is maintained at a first d-c potential, the isolation electrode is maintained at a second different d-c potential, and the discrete electrodes are switched in turn to the second d-c potential for detecting the photogenerated currents at the discrete electrodes for flow in a common load.

* * * * *